(12) United States Patent
Uchida

(10) Patent No.: US 8,996,241 B2
(45) Date of Patent: Mar. 31, 2015

(54) VEHICLE BATTERY DIAGNOSIS SYSTEM

(75) Inventor: Masatoshi Uchida, Toyota (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 261 days.

(21) Appl. No.: 13/124,743

(22) PCT Filed: Oct. 19, 2009

(86) PCT No.: PCT/IB2009/007120
§ 371 (c)(1),
(2), (4) Date: Apr. 18, 2011

(87) PCT Pub. No.: WO2010/052533
PCT Pub. Date: May 14, 2010

(65) Prior Publication Data
US 2011/0218703 A1    Sep. 8, 2011

(30) Foreign Application Priority Data

Nov. 6, 2008 (JP) .................. 2008-285566

(51) Int. Cl.
*G01M 17/00* (2006.01)
*G06F 7/00* (2006.01)
(Continued)

(52) U.S. Cl.
CPC .......... *G01R 31/3689* (2013.01); *B60L 3/0046* (2013.01); *B60L 11/14* (2013.01); *B60L 11/1824* (2013.01); *B60L 11/1851* (2013.01); *B60L 11/1853* (2013.01); *B60L 11/1857* (2013.01); *B60L 11/1861* (2013.01);
(Continued)

(58) Field of Classification Search
USPC ......... 320/104, 106, 122, 125, 132, 134, 136, 320/137; 701/33, 29.1, 29.4, 29.6, 31.4, 701/31.6, 34.4
See application file for complete search history.

(56) References Cited

U.S. PATENT DOCUMENTS 4,388,582 A * 6/1983 Saar et al. ..................... 320/156
5,377,098 A * 12/1994 Sakai .............................. 705/29
(Continued)

FOREIGN PATENT DOCUMENTS

JP    A 10-004603        1/1998
JP    A-2002-56902       2/2002
(Continued)

OTHER PUBLICATIONS

International Search Report issued in PCT/IB2009/007120, mailed Feb. 2, 2010.
(Continued)

*Primary Examiner* — Nicholas Kiswanto
(74) *Attorney, Agent, or Firm* — Oliff PLC

(57) ABSTRACT

A vehicle battery diagnosis system diagnoses the state of degradation of a battery of a vehicle equipped with the battery as a motive power source. The system includes: an information accumulation portion that accumulates degradation information regarding the battery; an information processing portion that reads information from the information accumulation portion, and that creates a plurality of types of screen information that are different from each other in display format, for a plurality of information recipients; a display portion that displays a screen that corresponds to at least one of the types of screen information created by the information processing portion.

14 Claims, 7 Drawing Sheets

(51) Int. Cl.
*G06F 11/30* (2006.01)
*G06F 19/00* (2011.01)
*G07C 5/00* (2006.01)
*G01R 31/36* (2006.01)
*B60L 3/00* (2006.01)
*B60L 11/14* (2006.01)
*B60L 11/18* (2006.01)
*B60W 50/02* (2012.01)
*G06F 1/28* (2006.01)
*H01M 10/42* (2006.01)
*H01M 10/48* (2006.01)
*G01R 31/00* (2006.01)

(52) U.S. Cl.
CPC ......... *B60L 2210/40* (2013.01); *B60L 2250/16* (2013.01); *B60L 2260/44* (2013.01); *B60W 50/0205* (2013.01); *B60Y 2200/90* (2013.01); *G01R 31/007* (2013.01); *G06F 1/28* (2013.01); *G07C 5/008* (2013.01); *H01M 10/425* (2013.01); *H01M 10/482* (2013.01); *H01M 10/488* (2013.01); *Y02T 10/7005* (2013.01); *Y02T 10/7011* (2013.01); *Y02T 10/7016* (2013.01); *Y02T 10/7044* (2013.01); *Y02T 10/705* (2013.01); *Y02T 10/7077* (2013.01); *Y02T 10/7088* (2013.01); *Y02T 90/12* (2013.01); *Y02T 90/14* (2013.01); *Y02T 10/7241* (2013.01); *Y02T 90/127* (2013.01)
USPC ....... 701/34.4; 701/29.1; 701/29.4; 701/29.6; 701/31.9

(56) References Cited

U.S. PATENT DOCUMENTS

| | | | |
|---|---|---|---|
| 5,751,217 A * | 5/1998 | Kchao et al. | 340/636.16 |
| 5,939,861 A | 8/1999 | Joko et al. | |
| 6,232,743 B1 * | 5/2001 | Nakanishi | 320/104 |
| 6,424,157 B1 * | 7/2002 | Gollomp et al. | 324/430 |
| 6,433,513 B1 * | 8/2002 | Hayashi | 320/132 |
| 6,906,522 B2 * | 6/2005 | Bertness et al. | 324/426 |
| 7,362,074 B2 * | 4/2008 | Iwane et al. | 320/132 |
| 7,456,613 B2 * | 11/2008 | Uesaka et al. | 320/132 |
| 7,482,784 B2 * | 1/2009 | Nagaoka | 320/132 |
| 7,528,576 B2 * | 5/2009 | Ukon | 320/132 |
| 7,657,440 B2 * | 2/2010 | Kuwata et al. | 705/1.1 |
| 2003/0137277 A1 | 7/2003 | Mori et al. | |
| 2006/0006876 A1 | 1/2006 | Bertness | |
| 2007/0063675 A1 | 3/2007 | Walline et al. | |
| 2009/0326749 A1 | 12/2009 | Uchida | |
| 2012/0068715 A1 * | 3/2012 | Martaeng | 324/434 |

FOREIGN PATENT DOCUMENTS

| | | |
|---|---|---|
| JP | A-2002-157361 | 5/2002 |
| JP | A-2003-345427 | 12/2003 |
| JP | A-2005-157793 | 6/2005 |
| JP | A 2005-227141 | 8/2005 |
| JP | A-2006-323566 | 11/2006 |
| JP | A-2007-309839 | 11/2007 |
| JP | A-2008-083022 | 4/2008 |

OTHER PUBLICATIONS

Written Opinion issued in PCT/IB2009/007120, mailed 2/2/20210.
International Preliminary Report on Patentability issued in PCT/IB2009/007120, dated Nov. 5, 2010.

* cited by examiner

FIG. 6

DISPLAY SCREEN 1

RESULTS OF BATTERY DIAGNOSIS

| 1 | OK |
| 2 | OK |
| 3 | NG |
| 4 | NG |
| ⋮ | ⋮ |
| n−1 | NG |
| n | OK |

NUMBER OF NGS/NUMBER OF OKS = 3/(n−3)

[RETURN] [COMPARE PLANS]

[ENTIRE REPLACEMENT PLAN]

FIG. 7

DISPLAY SCREEN 2

RESULTS OF BATTERY DIAGNOSIS

|   | OK/NG | RANK | RESISTANCE VALUE | SOC |
|---|---|---|---|---|
| 1 | OK | − | R1 | SOC1 |
| 2 | OK | − | R2 | SOC2 |
| 3 | NG | A | R3 | SOC3 |
| 4 | NG | C | R4 | SOC4 |
| ⋮ | ⋮ | ⋮ | ⋮ | ⋮ |
| n−1 | NG | B | R(n−1) | SOC(n−1) |
| n | OK | − | Rn | SOCn |

[TO INITIAL MENU]

[COMPARE IN COST, REMAINING SERVICE LIFE, DELIVERY TIME]

FIG. 8

PLAN SETTING SCREEN

| PLAN | NUMBER OF REPLACEMENTS | COST | DELIVERY TIME | REMAINING SERVICE LIFE |
|---|---|---|---|---|
| A | 1 | XXA YEN | YYA DAYS | ZZA YEARS |
| B | 2 | XXB YEN | YYB DAYS | ZZB YEARS |
| C | 3 | XXC YEN | YYC DAYS | ZZC YEARS |

ZZD YEARS (PRESENT STATE)

RETURN

FIG. 9

PLAN A

COST　　　　　　　　　　　XXA YEN
DELIVERY TIME　　　　　　YYA DAYS
REMAINING SERVICE LIFE　ZZA YEARS
　　　　　　　　　　　　　(INCREASED FROM ZZD YEARS)

RETURN　　DECIDE

VEHICLE BATTERY DIAGNOSIS SYSTEM

BACKGROUND OF THE INVENTION

1. Field of the Invention

The invention relates to a vehicle battery diagnosis system and, more particularly, to a vehicle battery diagnosis system that diagnoses the state of degradation of a battery of a vehicle equipped with the battery as a motive power source.

2. Description of the Related Art

In recent years, taking into consideration environmental issues such as global warming and the like, the development of vehicles equipped with a battery as a motive power source, such as electric motor vehicles, hybrid motor vehicles, etc., is being vigorously pursued.

The battery degrades as time passes. Therefore, in the case where a battery degrades after many years of use, it becomes necessary to replace the battery.

Japanese Patent Application Publication No. 10-4603 (JP-A-10-4603) discloses a display device for a vehicle-mounted battery which displays information regarding the state of charge and the time of replacement of the battery installed in the vehicle.

This display device has a construction in which a narrow and long display portion that displays the state of the battery using a first division that indicates that the battery is in a good state, a second division that indicates that the battery needs to be replaced, and an intermediate division between the first division and the second division is disposed at a driver's seat.

In recent years, in the field of hybrid motor vehicles, a vehicle capable of plug-in charging whose battery is constructed so as to be able to be charged from an external device is being considered. In the case where the plug-in charging is possible, it is preferable that the battery be charged with as much power as possible so as to restrain the consumption of the fuel, such as gasoline or the like, in terms of reduction of exhaust gas and cost. However, such a manner of use leads to full use of the battery capacity, so that the service life of the battery is more greatly affected than in a vehicle that is not capable of plug-in charging. Therefore, it is becoming increasingly important to diagnose the service life of the battery.

In the case where information regarding such a battery is displayed, a manufacturer, a dealer and a user desire different kinds of information. Manufacturers, and maintenance-repair shops, such as a car dealer or the like, need more detailed information, while it is preferable to provide users with information that is easy to understand.

SUMMARY OF THE INVENTION

The invention provides a vehicle battery diagnosis system capable of providing a plurality of information recipients with information that is suitable respectively to each of the information recipients.

A vehicle battery diagnosis system in accordance with a first aspect of the invention is a vehicle battery diagnosis system that diagnoses state of degradation of a battery of vehicle equipped with the battery as a motive power source. The system includes: an information accumulation portion that accumulates degradation information regarding the battery; an information processing portion that reads the degradation information from the information accumulation portion, and that creates a plurality of types of screen information that are different from each other in display format, for a plurality of information recipients; and a display portion that displays a screen that corresponds to at least one of the plurality of types of screen information created by the information processing portion.

Besides, in the vehicle battery diagnosis system in accordance with the first aspect, the battery may include a plurality of battery units each of which is separately replaceable, and the degradation information may include a plurality of pieces of unit degradation information that correspond to each of the plurality of battery units; and the plurality of screens that correspond to the plurality of pieces of screen information may include a first screen, and a second screen in which more information is displayed than in the first screen.

Besides, in the vehicle battery diagnosis system in accordance with the first aspect, the first screen may display number of and position of at least one battery unit whose degree of degradation is greater than a predetermined threshold value, in a recognizable manner; and the second screen may display number of and position of at least one battery unit whose degree of degradation is greater than a predetermined threshold value, in a recognizable manner, and may display numerical data that shows the degrees of degradation that correspond to each one of the plurality of battery units.

Besides, the vehicle battery diagnosis system in accordance with the foregoing first aspect may further include a remaining service life estimation portion that estimates a remaining service life of the battery as a whole based on the plurality of pieces of unit degradation information, and the remaining service life estimation portion may estimate a present remaining service life of the battery, and a remaining service life of the battery in a case where at least one of the plurality of battery units is replaced, and may cause the display portion to display the present remaining service life, and the remaining service life.

Besides, in the vehicle battery diagnosis system in accordance with the first aspect, the remaining service life estimation portion may estimate a plurality of remaining service lives that correspond to a plurality of replacement plans that are different from each other in combination of battery units to be replaced, among the plurality of battery units, and may cause the display portion to display the plurality of remaining service lives.

Besides, the vehicle battery diagnosis system in accordance with the first aspect may further include a cost calculation portion that calculates costs that correspond to the plurality of replacement plans, and that causes the display portion to display the costs.

Besides, in the vehicle battery diagnosis system in accordance with the first aspect, the replacement plans may be set based on ranks of the plurality of battery units which are set according to the degrees of degradation of the plurality of battery units.

Besides, in the vehicle battery diagnosis system in accordance with the first aspect, the plurality of information recipients may include a user of the vehicle, and a repair person for the vehicle.

Besides, the vehicle battery diagnosis system in accordance with the first aspect may further include a delivery time inquiry portion that inquires of a database of a battery unit manufacturer about delivery times that correspond to the plurality of replacement plans, and that causes the display portion to display the delivery times.

Besides, the vehicle battery diagnosis system in accordance with the first aspect may further include a battery diagnosis portion that is connected to the vehicle, and acquires degradation information regarding the battery, and performs a diagnosis of the battery, and accumulates diagnostic results in the information accumulation portion.

A vehicle battery diagnosis method in accordance with a second aspect of the invention is a vehicle battery diagnosis method that diagnoses state of degradation of a battery of a vehicle equipped with the battery as a motive power source, the method including: detecting degradation of the battery; determining an attribute of an information recipient; creating screen information based on the degradation information detected and the attribute determined; and displaying the screen information created.

The vehicle battery diagnosis method in accordance with the second aspect may further include accumulating the degradation information regarding the battery.

According to the invention, a plurality of information recipients can each be provided with optimal information. For example, more detailed information can be provided for a manufacturer and a dealer, and easy-to-understand information can be provided for a user, so as to be helpful in decision regarding the replacement of the battery.

BRIEF DESCRIPTION OF THE DRAWINGS

The foregoing and/or further objects, features and advantages of the invention will become more apparent from the following description of example embodiments with reference to the accompanying drawings, in which like numerals are used to represent like elements and wherein:

FIG. 6 is a diagram showing an example of a screen of simple display produced in step S5 in FIG. 5;

FIG. 7 is a diagram showing an example of detailed display of diagnostic results that is displayed in step S10 in FIG. 5;

FIG. 8 shows an example of a plan setting screen displayed in step S14 in FIG. 5; and FIG. 9 is a diagram showing a screen that is displayed in the case where a plan A is selected in FIG. 8.

DETAILED DESCRIPTION OF EMBODIMENTS

Figure 1:
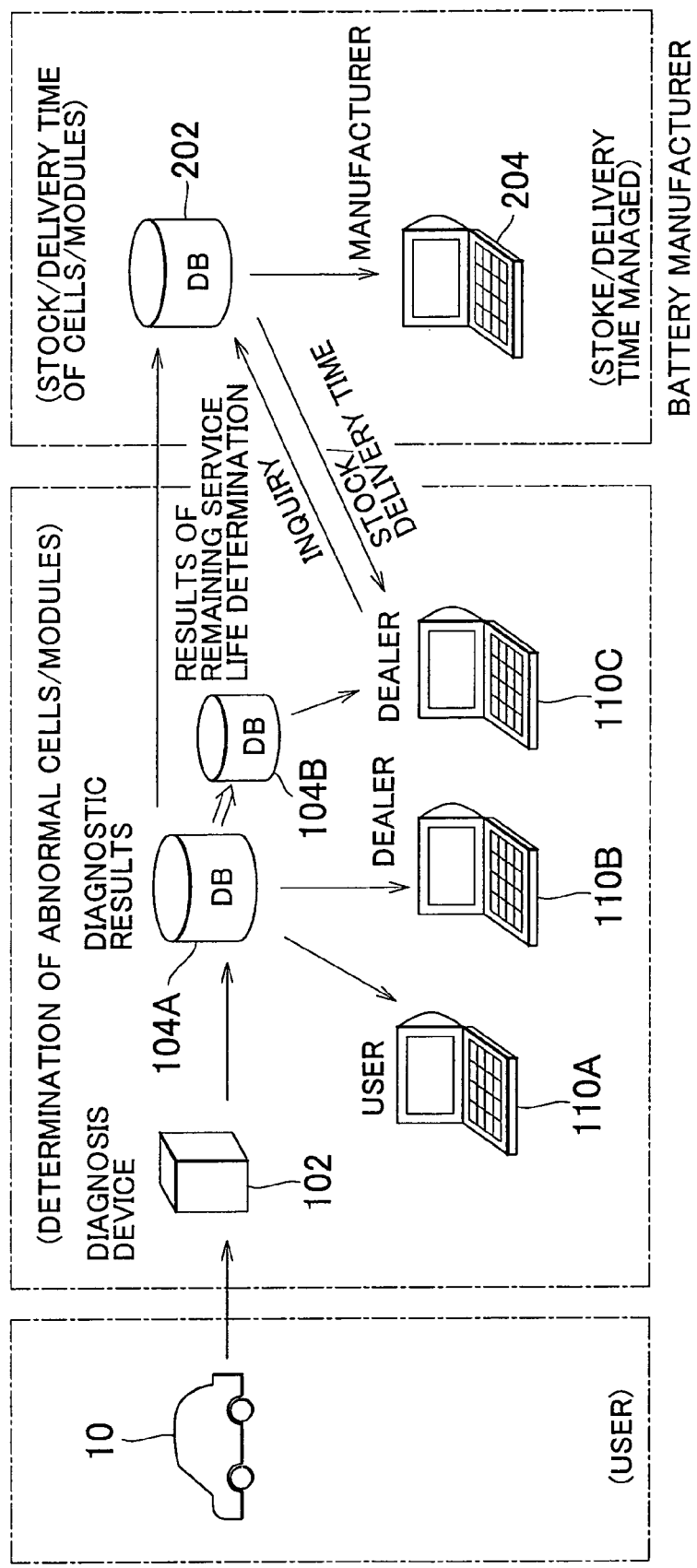
FIG. 1 is a block diagram showing a general construction of a vehicle battery diagnosis system of an embodiment of the invention.

Embodiments of the invention will be described in detail hereinafter with reference to the drawings. Incidentally, the same or comparable portions are represented by the same reference characters, and descriptions thereof will not be repeated.

FIG. 1 is a block diagram showing a general construction of a vehicle battery diagnosis system of an embodiment of the invention. Referring to FIG. 1, a user who uses the vehicle 10 takes the vehicle to a maintenance-repair shop, such as a car dealer or the like, or the like. Then, the vehicle 10 is connected to a battery diagnosis portion 102. The battery diagnosis portion 102 measures the state of a battery of the vehicle 10, or reads out results of measurements that an ECU of the vehicle has carried out, and then perform diagnosis, and stores results of the diagnosis in a diagnostic result database 104A.

The user operates a terminal 110A to read diagnostic results from the database 104A, and causes the results to be displayed on a monitor screen of the terminal 110A. The maintenance-repair shop, such as a car dealer or the like, operates a terminal 110B so as to call up information that includes results of determination of an abnormal cell or module and also characteristics thereof, from the database 104A, and to display the information on a monitor screen of the terminal 110B. Besides, the maintenance-repair shop, such as a car dealer or the like, operates another terminal 110C so as to calculate the remaining service life of the battery as a whole at the time of the replacement of one or more of the modules of the battery on the basis of the diagnostic results stored in the database 104A, and so as to access a database 104B and display the result of determination about the remaining service life on a monitor screen of the terminal 110C. The diagnostic results are also transferred to a database 202 of the battery manufacturer, so that engineers at the manufacturer can examine the content of the results by operating the terminal 204. Incidentally, although FIG. 1 illustrates that the terminals 110A, 110B, 110C are each able to access a specific database, that is, the databases 104A, 104B, 202, respectively, it may be considered that actually, each of the terminals 110A, 110B, 110C is able to access all the databases 104A, 104B, 202.

Besides, at the battery manufacturer, the stock and the delivery time of replacement battery modules are managed, and management data is input from the terminal 204, and is stored in the database 202. The maintenance-repair shop, such as a car dealer or the like, inquires of the manufacturer's database 202 about the stock or the deliver time from the terminal 110C, so that information that shows the stock or the delivery time is transmitted from the database 202 to the dealer's terminal 110C. The maintenance-repair shop, such as a car dealer or the like, can cause combinations of the remaining service life and the stock or the delivery time to be displayed on the monitor screen of the terminal 110C, to help select a replacement plan.

Figure 2:
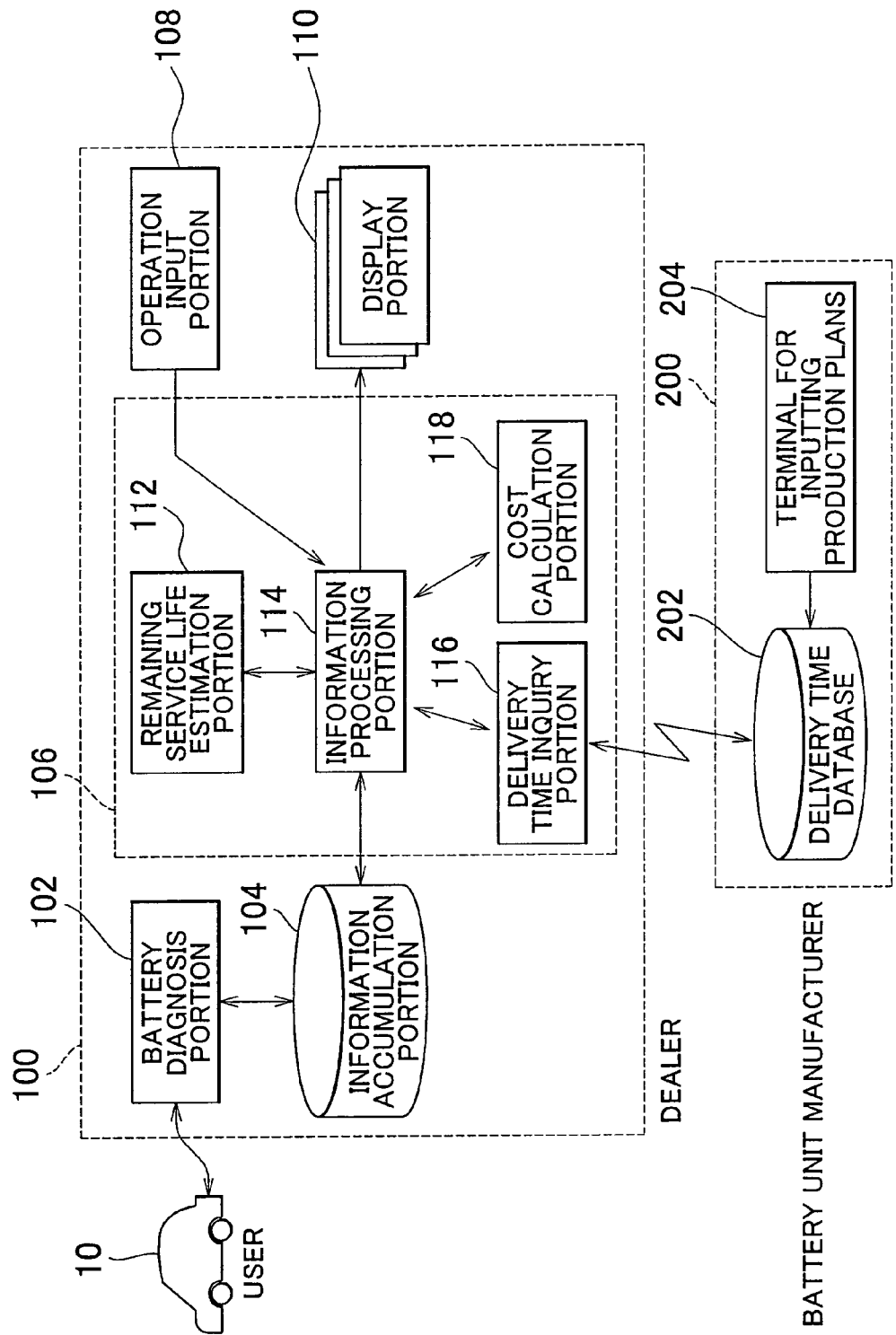
FIG. 2 is a block diagram showing a construction of the vehicle battery diagnosis system of the embodiment.

FIG. 2 is a block diagram showing a construction of a vehicle battery diagnosis system of this embodiment. Referring to FIG. 2, a vehicle battery diagnosis system 100 of this embodiment is disposed at a vehicle maintenance-repair shop, such as a car dealer or the like. The vehicle battery diagnosis system 100 includes: a battery diagnosis portion 102 that is connected to the vehicle 10 owned by a user, and that performs diagnosis of the battery; an information accumulation portion 104 that accumulates degradation information regarding the battery which the battery diagnosis portion 102 has diagnosed; a control device 106 that is realized, for example, by a computer; an operation input portion 108 that is used by a human to input an instruction or the like for the control device 106; and a display portion 110 that displays screens that the control device 106 creates on the basis of the information stored in the information accumulation portion 104. The control device 106 includes an information processing portion 114, a remaining service life estimation portion 112, a cost calculation portion 118, and a delivery time inquiry portion 116.

The information processing portion 114 reads from the information accumulation portion 104 the degradation information regarding the battery that is accumulated in the information accumulation portion 104, and creates a plurality of kinds of screen information in different display formats for a plurality of recipients of the information, for example, the user, the maintenance-repair shop, etc. The plurality of kinds of screen information is selectively displayed on the display portion 110. That is, the display portion 110 displays screens that correspond to at least some of the screen information that is created by the information processing portion 114.

The remaining service life estimation portion 112 estimates the remaining service life of the entire battery in the case where a plurality of battery units mounted in the vehicle 10 are partially or entirely replaced. The cost calculation portion 118 calculates the cost that is needed to replace one or more battery units. The delivery time inquiry portion 116 inquires of a delivery database 202 of the battery unit manufacturer about the delivery time separately for each plan of replacement of battery units, and transmits the delivery time that has been obtained through inquiry to the information processing portion 114.

A production management system 200 of the battery unit manufacturer includes a terminal 204 for inputting a production plan, and the delivery time database 202 in which the delivery time and stocks, etc. are retained.

Figure 3:
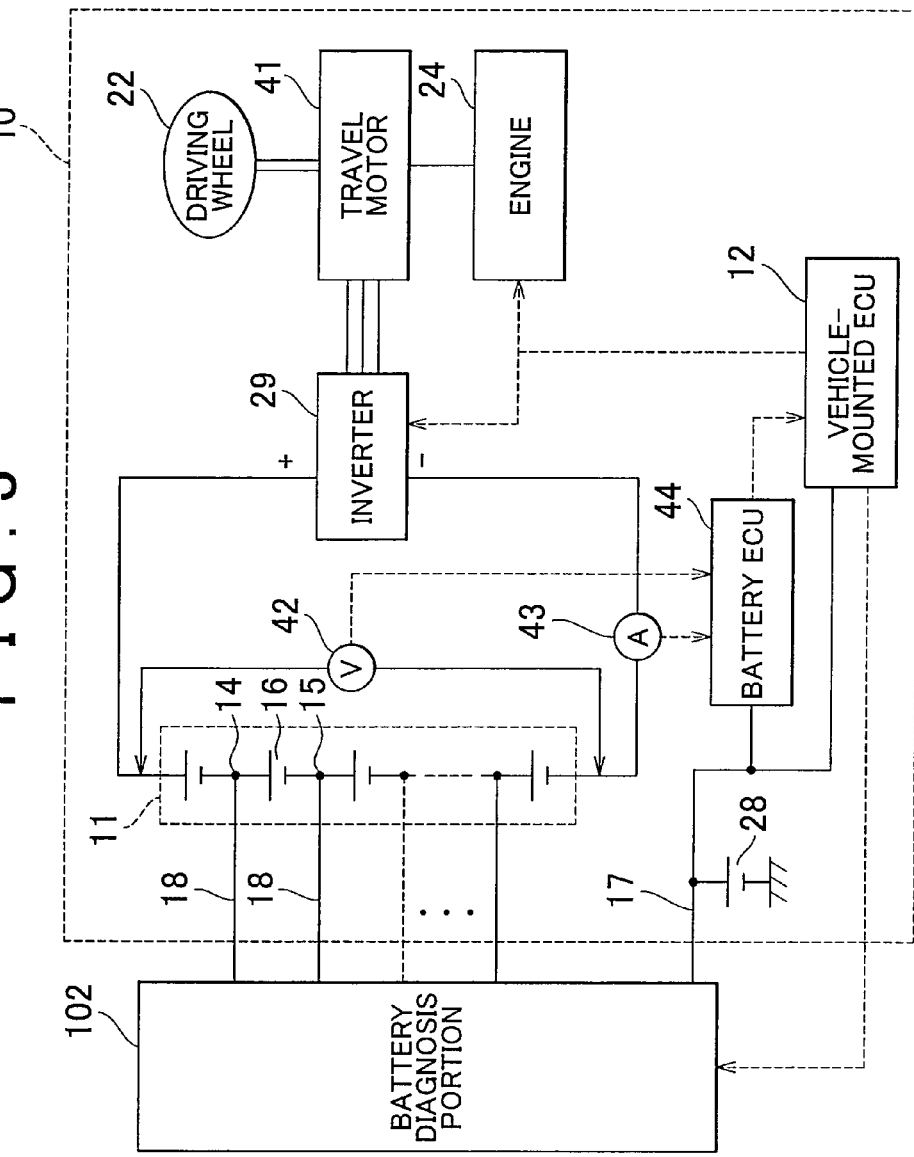
FIG. 3 is a block diagram showing a construction example of a vehicle shown in FIG. 2.

FIG. 3 is a block diagram showing an example of a construction of the vehicle 10 shown in FIG. 2. Referring to FIG. 3 the vehicle 10 includes driving wheel 22, a travel motor 41, an engine 24, and inverter 29, and a battery 11. The battery 11 supplies electric power to the inverter 29 that drives and controls the travel motor 41.

The vehicle 10 further includes a voltage sensor 42, a current sensor 43, a battery ECU 44, a vehicle-mounted ECU 12, and an accessory power source 28.

Incidentally, as shown in FIG. 3, the voltage value of the battery 11 is measured by the voltage sensor 42, and the current value is measured by the current sensor 43, and the current value and the voltage value are sent to the battery ECU 44. The battery ECU calculates a state of charge (SOC) of the battery 11 on the basis of the current value and the voltage value.

The battery diagnosis portion 102 shown in FIG. 3 is connected to the vehicle 10 to perform a diagnosis on the vehicle 10. Firstly, the accessory power source 28 within the vehicle 10 is connected to the battery diagnosis portion 102 by a power cable 17. Because of this connection, a rated current is given to the battery diagnosis portion 102 from the vehicle side, where the service life of the battery is to be determined. That is, the battery diagnosis portion 102 does not need to have an electric power source therein, but can be provided as a device with a simple construction.

The battery diagnosis portion 102 is connected to the positive terminal 14 and the negative terminal 15 of each module 16 of the battery 11, via a test cable 18. Because of this connection, the voltage value of each module 16 of the battery 11 is measured. However, since the supply of power from the accessory power source 28 lowers the fuel economy of the vehicle 10, a separate external power source (not shown) may be used.

Although an example in which the vehicle 10 is a hybrid motor vehicle is illustrated in the drawings, the vehicle may also be an electric motor vehicle in the invention. Besides, the vehicle 10 may also be a hybrid vehicle capable of the plug-in charging which is constructed so that the battery 11 can be charged from an external device.

Figure 4:
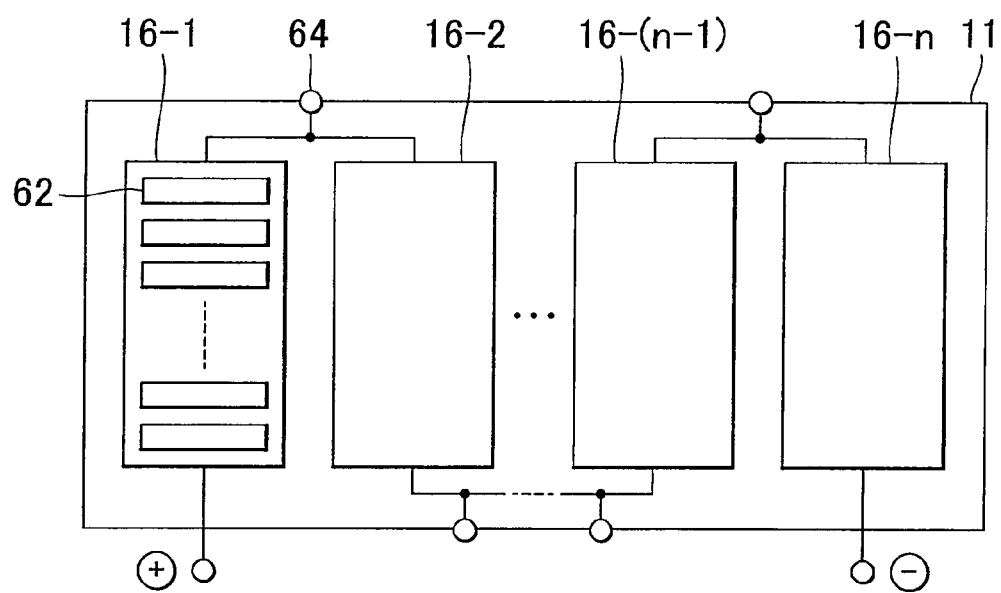
FIG. 4 is a diagram showing a detailed illustration of the construction of the battery shown in FIG. 3.

FIG. 4 is a diagram showing a detailed illustration of a construction of the battery 11 shown in FIG. 3. Referring to FIG. 4, the battery 11 includes battery modules 16-1 to 16-$n$ that are connected in series. The battery module 16-1 includes a plurality of battery cells 62 that are connected in series. Although not shown in the drawings, each of the battery modules 16-2 to 16-$n$ also includes a plurality of battery cells 62.

Each of intermediate connecting points between the battery modules 16-1 to 16-$n$ is provided with a terminal 64 that is provided for connecting a test cable for measurement. Therefore, the battery 11 is constructed so that the voltage of each battery module can be measured by connecting test cables 18 as shown in FIG. 3. Besides, the modules 16-1 to 16-$n$ are each separately detachable from a casing of the battery 11. Therefore, it is possible to easily replace only one or more battery modules that are degraded. In addition, the battery 11 may be constructed so that the replacement can be carried out in the unit of cell, or may also be constructed so that the voltage of each cell can be measured.

As a concrete example, the battery 11 is generally a battery of a high voltage of 144 to 288 V. For example, the battery 11 employed in this embodiment can be a nickel hydride battery, a lithium-ion battery, a lead-acid battery, etc. For example, in the case of a nickel hydride battery, the battery 11 has thirty modules 16 that are connected in series. Besides, in each module 16, six cells of 1.2 V (not shown) are connected in series. That is, in the case of a nickel hydride battery, the battery 11 has a rated voltage of 216 V.

Figure 5:
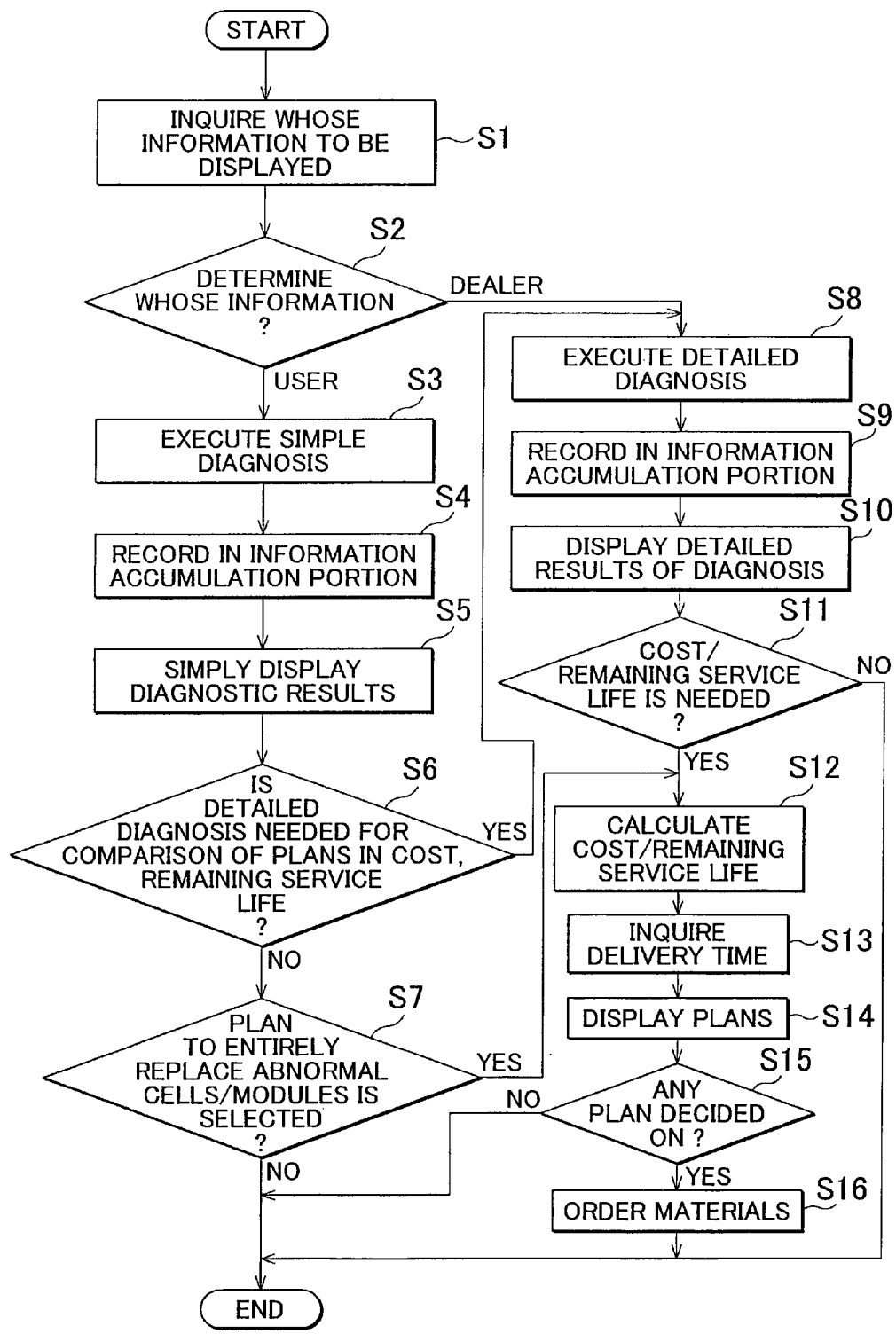
FIG. 5 is a flowchart showing a process that is executed by a control device shown in FIG. 2.

FIG. 5 is a flowchart showing a process that is executed by the control device 106 shown in FIG. 2. Referring to FIG. 2 and FIG. 5, firstly in step S1, inquiry of whose information is to be displayed is performed. For example, in the case where the display portion 110 and the operation input portion 108 are provided as a touch-panel display or the like, buttons that prompt the present operating person to specify whether the person is a user of the vehicle, that is, a customer, or an employee of a car dealer or a maintenance-repair shop may be displayed on the touch-panel display, and the inquiry may be completed when either one of the two buttons is selected.

Subsequently, in step S2, it is determined whose information is to be displayed. If the button selected on the touch panel is the button for a vehicle user, the process proceeds to step S3. On the other hand, if the button selected on the touch panel is the button for a car dealer, the process proceeds to step S8.

In step S3, a simple diagnosis for displaying results of a simple diagnosis. The simple diagnosis is, for example, a diagnosis that can be completed in about 30 minutes. In this simple diagnosis, for example, a process of measuring the voltage of each module and thereby making a determination regarding the degradation of each module.

Then in step S4, results of the diagnosis, that is, the voltage value of each module, the determination regarding each module as to whether or not the module is good, etc., are recorded in the information accumulation portion 104. Then in step S5, a simple display of the diagnostic results is performed in the display portion 110.

FIG. 6 is a diagram showing an example of a screen of the simple display in step S5 in FIG. 5. Referring to FIG. 6, results of the determination regarding each of the battery modules 1 to n as to whether the battery module is good (OK) or no good (NG) on the basis of a reference threshold value are displayed. Due to this display, the user recognizes the number of and the positions of modules whose degrees of degradation are larger than the predetermined threshold value. Besides, the number of OKs and the number of NGs are displayed in a right hand side in the screen. In the example shown in FIG. 6, the number of NGs/the number of OKs=3/n−3 is displayed.

In a lower right side portion of the screen, buttons for the user to selectively press are displayed, whereby the user can select any one of the three choices, "RETURN", "COMPARE PLANS" and "ENTIRE REPLACEMENT PLAN". A user may select the "ENTIRE REPLACEMENT PLAN", for example, if the user does not have much time but has some money to spare, or the like.

Referring to FIG. 2 and FIG. 5 again, in step S6, it is determined whether or not it is necessary to compare a plurality of plans in terms of the cost and the remaining service life and therefore a detailed diagnosis has been requested.

If in step S6 it is determined that it is necessary to compare plans in terms of the cost and the remaining service life, the process proceeds from step S6 to step S8. That is, in FIG. 6, if the "COMPARE PLANS" button is pressed, the process proceeds from step S6 to step S8. On the other hand, if such comparison is not necessary, the process proceeds from step S6 to step S7. In step S7, it is determined whether or not the plan to replace all the modules that have been determined as being NG (abnormal) has been selected (whether or not the "ENTIRE REPLACEMENT PLAN" button shown in FIG. 6 has been pressed). If in step S7 it is determined that the entire replacement plan has not been selected (e.g., if in FIG. 6 the "RETURN" button has been pressed), the process ends. On the other hand, if the entire replacement plan has been selected, the process proceeds from step S7 to step S12.

The execution of the detailed diagnosis in step S8 normally requires a long time. Therefore, for example, a user that wants to minimize the waiting time can press the entire replacement plan button in the display screen shown in FIG. 6.

In the case where the process proceeds to step S8 from step S2 or S6, the detailed diagnosis is executed. This detailed diagnosis is, for example, a diagnosis that requires longer time and achieves higher accuracy than the simple diagnosis executed in step 3, and sometimes requires that the vehicle be left at the dealer. For example, it is possible to re-measure the SOC or the like by performing the charging and discharging of the battery 11 in the detailed diagnosis. After the process proceeds to step S9, results of the detailed diagnosis are recorded in the information accumulation portion 104. Then in step S10, the detailed display of the diagnostic results is performed.

FIG. 7 is a diagram showing an example of the detailed display of diagnostic results that is displayed in step S10 in FIG. 5.

Referring to FIG. 7, displayed for each of the modules 1 to n are the result of the determination (OK or NG), the rank (A to C) of no good (degradation) in the case of an NG module, the resistance value, and the SOC. The data about NG modules are shown in double-line frames, or highlighted in different colors, for example, red, yellow, green, etc.

On the right side of the region in which the diagnostic results are shown, a "TO INITIAL MENU" button for commanding that the initial menu be displayed, and a "COMPARE COST, REMAINING SERVICE LIFE, DELIVERY TIME" button for moving to a screen of comparison of module replacement plans are displayed.

Referring back to FIG. 5, after the detailed display of the diagnostic results is executed in step S10, the process proceeds to step S11, in which it is determined whether or not there is a request for the display of the cost, the remaining service life, and the delivery time of battery modules. For example, in the case where the "ENTIRE REPLACEMENT PLAN" button is pressed in the screen shown in FIG. 6, the case where the "COMPARE COST, REMAINING SERVICE LIFE, DELIVERY TIME" button is pressed in the screen shown in FIG. 7, etc., it is determined that a cost/remaining service life/delivery time-display request is present If in step S11 it is determined that the cost/remaining service life/delivery time-display request is not present, the process ends. On the other hand, if in step S11 it is determined that the cost/remaining service life/delivery time-display request is present, the process proceeds to step S12.

In step S12, the remaining service life of the battery 11 as it is, and the remaining service life in the case where battery modules are replaced according to the plan or each of plans are calculated. The remaining service life of the present battery 11 can be determined from, for example, the increase in the internal resistance value, etc. Besides, as for the remaining service life after the replacement, it suffices to calculate the remaining service life by using as a reference a module that exhibits a characteristic indicating that the module is the most degraded among the battery modules that are not replaced. Besides, in step 12, the costs corresponding to the plurality of replacement plans are also calculated.

Subsequently in step S13, inquiry of the delivery time is performed separately for each plan. The delivery time inquiry portion 116 shown in FIG. 2 communicates with the delivery time database 202 of the battery unit manufacturer, and acquires the time for delivery of the battery units needed according to each plan.

Subsequently in step S14, plans are displayed. FIG. 8 shows an example of a plan setting screen that is displayed in step S14 in FIG. 5.

The screen shown in FIG. 8 displays a plan A to replace only the A-rank degraded battery modules, a plan B to replace the A-rank and B-rank degraded battery modules, and a plan C to replace all the A to C-rank degraded battery modules, after the detailed diagnosis starting at step S8 has been executed and the ranks of degradation of the battery modules have been determined. In the plan A, the number of rank-A degraded modules is 1 as shown in FIG. 7, and therefore the number of modules to be placed is 1. Besides in FIG. 8, "XXA yen" as the cost in the case where one module is replaced is displayed, and "YYA days" as the delivery time for the one module is displayed, and "ZZA years" as the remaining service life is displayed.

In the plan B, the third module in FIG. 7 is of the rank A, and the (n−1)th module in FIG. 7 is of the rank B, and these two modules are replaced. Thus, the number of modules to be replaced is 2. Besides, "XXB yen" as the cost, "YYB days" as the delivery time, and the "ZZB years" as the remaining service life are displayed as shown in FIG. 8.

In the plan C, the third, fourth and (n−1)th battery modules in FIG. 7, that is, three modules, are to be replaced. Therefore, the number of modules to be replaced is 3. Besides, "XXC yen" as the cost, the "YYC days" as the delivery time, and "ZZC year" as the remaining service life are displayed as shown in FIG. 8. The remaining service life of ZZD years in the present state without replacement is displayed for reference below the plan C. The vehicle user or the dealer's employee can judge which plan to select, in view of the balance among the cost, the delivery time and the remaining service life, by looking at the plan setting screen. In the screen as shown in FIG. 8, a desired plan can be selected by pressing a corresponding one of the select buttons of the plan A, the plan B and the plan C.

FIG. 9 is a diagram showing a screen that is displayed in the case where the plan A is selected in the screen shown in FIG. 8. Referring to FIG. 9, information regarding the plan A, including "Plan A" as the name of the selected plan, the cost of XXA yen, the delivery time of YYA days, and the remaining service life of ZZA years (increased from ZZD years), is displayed for confirmation. In a lower portion of the screen, a "RETURN" button and a "DECIDE" button are displayed. By pushing the "DECIDE" button, the plan A can be decided on.

Incidentally, in the case where the entire replacement plan is selected in step S7 in FIG. 5, too, it suffices to simply display the information as shown in FIG. 9 (the information to be displayed in the case where the plan C is selected in FIG. 8) in place of the screen shown in FIG. 8, so as to inquire of the operating person whether or not to decide on the plan. If the "DECIDE" button as shown in FIG. 9 is selected after the calculation of the cost/remaining service life in step S12, the inquiry of the delivery time in step S13, and the display of plans in step S14 end, the process proceeds from step S15 to step S16, in which the battery modules needed for the decided plan are ordered from the dealer to the battery unit manufacturer, automatically by a computer or the like. Incidentally, in the case where the car user performs the ordering after the process proceeds from step S7 to step 12, it is also permissible to fix the order after inquiry from the manufacturer or dealer to the car user is performed. After the ordering is completed in step S16, the process ends. On the other hand, if in step S15 it is determined that no plan is decided on, the process immediately ends.

Finally, the foregoing embodiment of this invention will be summarized with reference to the drawings. The vehicle battery diagnosis system 100 of this embodiment is, as shown in FIG. 2, a vehicle battery diagnosis system that diagnoses the state of degradation of the battery 11 of the vehicle 10 equipped with the battery as a motive power source, the system including: the information accumulation portion 104 that accumulates degradation information regarding the battery 11; the information processing portion 114 that reads information from the information accumulation portion 104, and that creates a plurality of screen information pieces of different display formats for a plurality of information recipients; and the display portion 110 that displays screens that correspond to at least one of the plurality of screen information pieces that the information processing portion 114 creates.

As shown in FIG. 4, the battery 11 includes battery modules 16-1 to 16-$n$ that are battery units that are separately replaceable. Incidentally, the battery unit may also be each battery cell 62. The degradation information includes units degradation information pieces that correspond to a plurality of battery units. The plurality of screens that correspond to the screen information pieces include a first screen as shown in FIG. 6, and a second screen as shown in FIG. 7 that displays more information than the first screen shown in FIG. 6.

The first screen shown in FIG. 6 displays the number of and the positions of battery units whose degrees of degradation are larger than a predetermined threshold value, so that the number and the position thereof are recognizable. Besides, the second screen shown in FIG. 7 displays the number of and the positions of battery units whose degrees of degradation are larger than a predetermined threshold value, so that the number and the positions thereof are recognizable, and also displays numerical data (e.g., the resistance value or the SOC) that shows the degrees of degradation that correspond to each of a plurality of battery units.

Referring back to FIG. 2, the vehicle battery diagnosis system 100 further includes the remaining service life estimation portion 112 that estimates the remaining service life of the battery 11 as a whole on the basis of the degradation information about the plurality of units. The remaining service life estimation portion 112 estimates the present remaining service life, and remaining service life lengths that will result when at least one of the plurality of battery units has been replaced, and causes the display portion 110 to display the lengths of remaining service life as shown in FIGS. 8 and 9.

The remaining service life estimation portion 112 estimates a plurality of remaining service life lengths corresponding to a plurality of replacement plans that are different from each other in the combination of battery units to be replaced, among the plurality of battery units, and causes the display portion 110 to display the remaining service life lengths as shown in FIG. 8. The vehicle battery diagnosis system 100 further includes the cost calculation portion 118 that calculates the costs that correspond to the plurality of replacement plans, and causes the display portion 110 to display the costs.

Preferably, the plurality of information recipients include the users of vehicles, and maintenance-repair shops (dealers).

The vehicle battery diagnosis system 100 further includes the delivery time inquiry portion 116 that inquires of the delivery time database 202 of the battery unit manufacturer about the delivery times that correspond to the plurality of replacement plans, and that causes the display portion 110 to display the delivery times.

Preferably, the vehicle battery diagnosis system 100 further includes a battery diagnosis portion 102 that is connected to the vehicle 10 and acquires degradation information regarding the battery 11, and performs diagnosis of the battery 11, and that causes the information accumulation portion 104 to accumulate results of the diagnosis.

As described above, the vehicle battery diagnosis system of the embodiment is able to display diagnostic results in a short time easily for a user, and, in the case where detailed information is needed, is able to present a plurality of plans, and display the costs, the delivery times, and the remaining service life lengths in such a fashion that one of the plans can easily be selected. An employee of a dealer can grasp the state of the battery from detailed information regarding the battery's internal resistance, the battery's state of charge, etc., and can make good use of the information for data collection.

It is to be understood that the embodiments and the like disclosed above are merely illustrative in all respects, and are not restrictive. The scope of the invention is shown not by the foregoing description but by the claims for patent, and is intended to cover all modifications within the meaning and scope equivalent to the claims.

While the invention has been described with reference to example embodiments thereof, it should be understood that the invention is not limited to the example embodiments or constructions. To the contrary, the invention is intended to cover various modifications and equivalent arrangements. In addition, while the various elements of the example embodiments are shown in various combinations and configurations, which are exemplary, other combinations and configurations, including more, less or only a single element, are also within the spirit and scope of the invention.

The invention claimed is:

1. A vehicle battery diagnosis system connectable to a vehicle that diagnoses the state of degradation of a battery of the vehicle equipped with the battery as a motive power source, comprising:
   an information accumulation portion adapted to accumulate degradation information regarding the battery, the battery including a plurality of battery units, wherein the degradation information includes a plurality of pieces of unit degradation information for the plurality of battery units and the information accumulation portion is accessible for a plurality of information recipients;
   an information processing portion adapted to read the degradation information from the information accumulation portion, and adapted to create a plurality of types of screen information on a basis of the degradation information that are different from each other in display format and that are specific for different types of information recipients out of the plurality of information recipients; and
   a display portion adapted to display at least one of a plurality of screens that corresponds to at least one of the plurality of types of screen information created by the information processing portion, wherein the plurality of screens that correspond to the plurality of types of screen information include a first screen and a second screen, the second screen including a first type of screen information which is included in the first screen and a second type of screen information which is not included in the first screen, the first and second screens being switchable according to the type of information for the information recipient, the first screen is adapted to display a number of and a position of at least one battery unit having a degree of degradation greater than a predetermined threshold value, in a recognizable manner, and the second screen is adapted to display a number of and a position of at least one battery unit having a degree of degradation greater than the predetermined threshold value, in a recognizable manner, and is adapted to display numerical data that shows the degree of degradation for each one of the plurality of battery units.

2. The vehicle battery diagnosis system according to claim 1, wherein:

each of the battery units is separately replaceable.

3. The vehicle battery diagnosis system according to claim 2, further comprising a remaining service life estimation portion adapted to estimate a remaining service life of the battery as a whole based on the plurality of pieces of unit degradation information, wherein the remaining service life estimation portion is adapted to estimate a present remaining service life of the battery, and a remaining service life of the battery in a case where at least one of the plurality of battery units is replaced, and is adapted to cause the display portion to display the present remaining service life, and the remaining service life.

4. The vehicle battery diagnosis system according to claim 3, wherein the remaining service life estimation portion is adapted to estimate a plurality of remaining service lives that correspond to a plurality of replacement plans that are different from each other in combination of battery units to be replaced, among the plurality of battery units, and is adapted to cause the display portion to display the plurality of remaining service lives.

5. The vehicle battery diagnosis system according to claim 4, further comprising a cost calculation portion adapted to calculate costs that correspond to the plurality of replacement plans, and that causes the display portion to display the costs.

6. The vehicle battery diagnosis system according to claim 4, wherein the replacement plans are set based on ranks of the plurality of battery units which are set according to the degrees of degradation of the plurality of battery units.

7. The vehicle battery diagnosis system according to claim 4, wherein the plurality of information recipients include a user of the vehicle, and a repair person for the vehicle.

8. The vehicle battery diagnosis system according to claim 4, further comprising a delivery time inquiry portion that inquires of a database of a battery unit manufacturer about delivery times that correspond to the plurality of replacement plans, and causes the display portion to display the delivery times.

9. The vehicle battery diagnosis system according to claim 1, further comprising a battery diagnosis portion that is connected to the vehicle, and acquires degradation information regarding the battery, and is adapted to perform a diagnosis of the battery, and is adapted to accumulate diagnostic results in the information accumulation portion, wherein the information accumulation portion is a database.

10. A vehicle battery diagnosis method that diagnoses state of degradation of a battery of a vehicle equipped with the battery as a motive power source, comprising:

detecting, with a battery diagnosis portion of a vehicle battery diagnosis system, degradation of the battery;

accumulating, with an information accumulation portion of the vehicle battery diagnosis system, the degradation information regarding the battery, the battery including a plurality of battery units, wherein the degradation information includes a plurality of pieces of unit degradation information for the plurality of battery units and which is accessible for a plurality of information recipients;

determining, with a control device of the vehicle battery diagnosis system, an attribute of a specific information recipient out of a plurality of different types of information recipients;

creating screen information based on the degradation information detected and the attribute determined; and displaying the screen information created on a display, wherein the screen information displayed based on the created screen information includes a first screen and a second screen, the second screen including a first screen information which is included in the first screen and a second screen information which is not included in the first screen, the first and second screens being switchable according to the type of information for the information recipient, the first screen is adapted to display a number of and a position of at least one battery unit having a degree of degradation greater than a predetermined threshold value, in a recognizable manner, and the second screen is adapted to display a number of and a position of at least one battery unit having a degree of degradation greater than the predetermined threshold value, in a recognizable manner, and is adapted to display numerical data that shows the degree of degradation for each one of the plurality of battery units.

11. A vehicle external vehicle battery diagnosis system connectable to a vehicle that diagnoses the state of degradation of a battery of the vehicle equipped with the battery as a motive power source, comprising:

an information accumulation portion adapted to accumulate degradation information regarding the battery, the battery including a plurality of battery units, wherein the degradation information includes a plurality of pieces of unit degradation information for the plurality of battery units and the information accumulation portion is accessible for a plurality of information recipients;

an information processing portion adapted to read the degradation information from the information accumulation portion, and adapted to create a plurality of types of screen information on a basis of the degradation information that are different from each other in display format and that are specific for different types of information recipients out of the plurality of information recipients;

a remaining service life estimation portion adapted to estimate a remaining service life of the battery as a whole based on the plurality of pieces of unit degradation information; and a display portion adapted to display at least one of a plurality of screens that corresponds to at least one of the plurality of types of screen information created by the information processing portion, wherein:

the plurality of screens that correspond to the plurality of types of screen information include a first screen and a second screen, the second screen including a first type of screen information which is included in the first screen and a second type of screen information which is not included in the first screen, the first and second screens being switchable according to the type of information for the information recipient, and the remaining service life estimation portion is adapted to estimate a present remaining service life of the battery, and a remaining service life of the battery in a case where at least one of the plurality of battery units is replaced, and is adapted to cause the display portion to display the present remaining service life, and the remaining service life.

12. The vehicle battery diagnosis system according to claim 11, wherein the first and second screens being switchable according to the type of information for the information recipient.

13. A vehicle external vehicle battery diagnosis system connectable to a vehicle that diagnoses the state of degradation of a battery of the vehicle equipped with the battery as a motive power source, comprising:

an information accumulation portion adapted to accumulate degradation information regarding the battery, the battery including a plurality of battery units, wherein the information accumulation portion is accessible for a plurality of information recipients;

an information processing portion adapted to read the degradation information from the information accumulation portion, and adapted to create a plurality of types of screen information that are different from each other in display format, for the plurality of information recipients; and a display portion adapted to display a screen that corresponds to at least one of the plurality of types of screen information created by the information processing portion, wherein the display portion displays at least one of (i) a plurality of replacement plans that are different from each other in combination of battery units to be replaced, among the plurality of battery units or (ii) costs that correspond to the plurality of replacement plans.

14. The vehicle battery diagnosis system according to claim 13, wherein the screen information displayed based on the created screen information includes a first screen and a second screen, the first and second screens being switchable according to the type of information for the information recipient.

* * * * *

UNITED STATES PATENT AND TRADEMARK OFFICE
CERTIFICATE OF CORRECTION

| | | |
|---|---|---|
| PATENT NO. | : 8,996,241 B2 | Page 1 of 1 |
| APPLICATION NO. | : 13/124743 | |
| DATED | : March 31, 2015 | |
| INVENTOR(S) | : Masatoshi Uchida | |

It is certified that error appears in the above-identified patent and that said Letters Patent is hereby corrected as shown below:

On the title page item (22) PCT Filed: "Oct. 19, 2009" should be ---Oct. 13, 2009---.

Signed and Sealed this
Twenty-fifth Day of August, 2015

Michelle K. Lee
*Director of the United States Patent and Trademark Office*